(12) United States Patent
Hansen

(10) Patent No.: US 8,043,797 B2
(45) Date of Patent: Oct. 25, 2011

(54) LITHOGRAPHIC APPARATUS AND DEVICE MANUFACTURING METHOD

(75) Inventor: Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 1086 days.

(21) Appl. No.: 11/115,386

(22) Filed: Apr. 27, 2005

(65) Prior Publication Data

US 2006/0078806 A1  Apr. 13, 2006

Related U.S. Application Data

(60) Provisional application No. 60/617,211, filed on Oct. 12, 2004.

(51) Int. Cl.
*G03F 9/00* (2006.01)
*G03B 27/42* (2006.01)
*G03B 27/54* (2006.01)
*G03B 27/32* (2006.01)

(52) U.S. Cl. ............ 430/322; 430/5; 430/30; 430/22; 430/311; 430/396

(58) Field of Classification Search ............ 430/5, 30, 430/22, 311, 322, 396; 355/53, 67, 77
See application file for complete search history.

(56) References Cited

U.S. PATENT DOCUMENTS

| | | | | |
|---|---|---|---|---|
| 5,447,810 A | * | 9/1995 | Chen et al. | 430/5 |
| 5,821,014 A | * | 10/1998 | Chen et al. | 430/5 |
| 6,452,662 B2 | * | 9/2002 | Mulkens et al. | 355/67 |
| 6,519,760 B2 | | 2/2003 | Shi et al. | |
| 6,787,272 B2 | * | 9/2004 | Yu | 430/5 |
| 2004/0209170 A1 | * | 10/2004 | Broeke et al. | 430/5 |
| 2004/0265710 A1 | | 12/2004 | Kohler et al. | |
| 2005/0081180 A1 | * | 4/2005 | Kotani et al. | 716/21 |

FOREIGN PATENT DOCUMENTS

| | | |
|---|---|---|
| EP | 1 237 046 A2 | 9/2002 |
| JP | 05-326370 A | 12/1993 |
| JP | 09-074063 A | 3/1997 |
| JP | 2003-234285 A | 8/2003 |
| JP | 2003-318100 A | 11/2003 |

\* cited by examiner

*Primary Examiner* — Thorl Chea
(74) *Attorney, Agent, or Firm* — Pillsbury Winthrop Shaw Pittman LLP

(57) ABSTRACT

A method for transferring an image of a mask pattern through a pitch range onto a substrate is presented. In an embodiment, the method includes illuminating the mask pattern of an attenuated phase shift mask using a multipole illumination that includes an on-axis component and an off-axis component, the mask pattern including non-printing assist features configured for a pitch larger than twice a minimum pitch of the mask pattern, and projecting an image of the illuminated mask pattern onto the substrate.

30 Claims, 13 Drawing Sheets

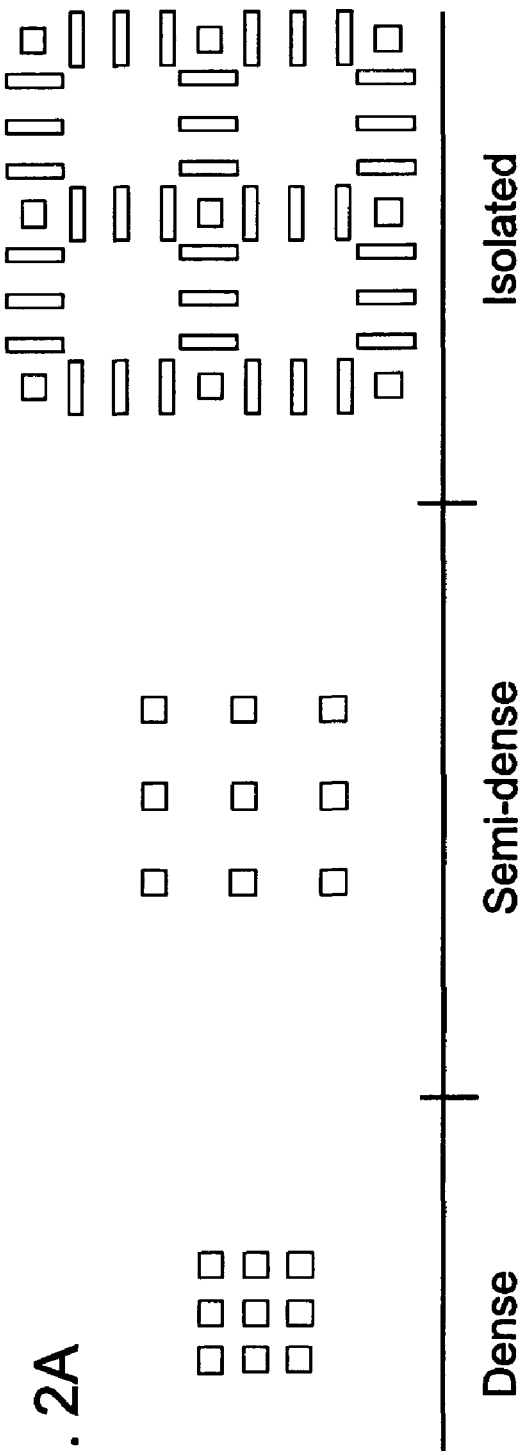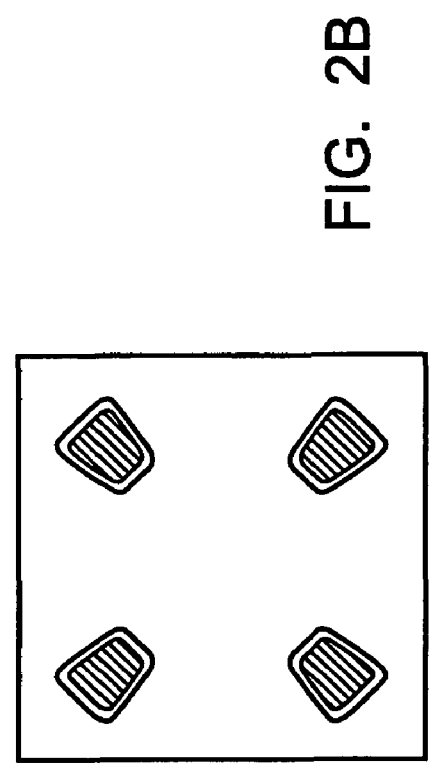
FIG. 2A
FIG. 2B

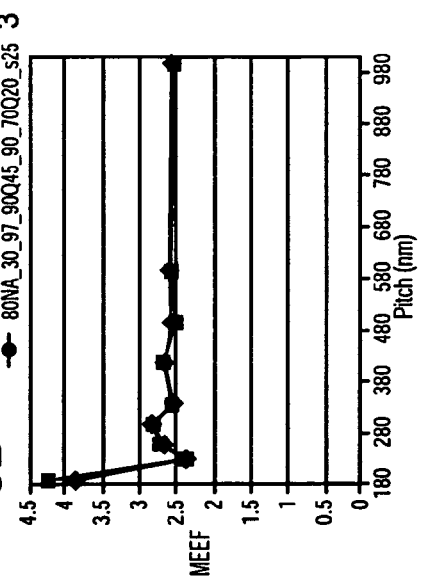
FIG. 8B
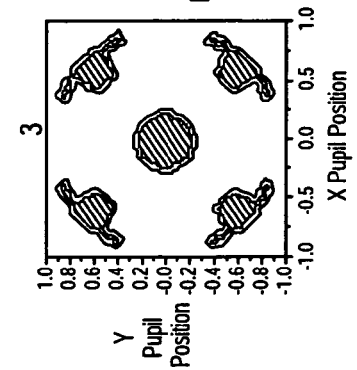
FIG. 8F
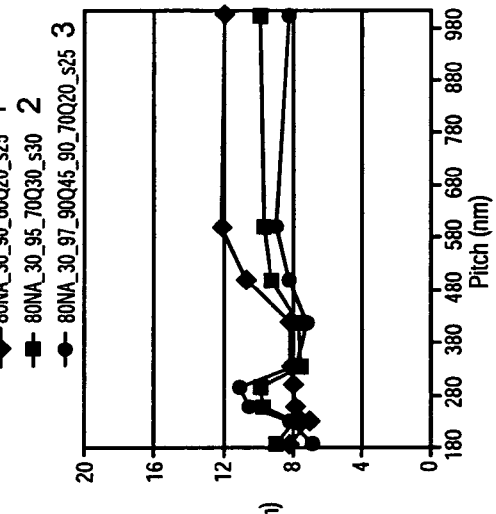
FIG. 8C
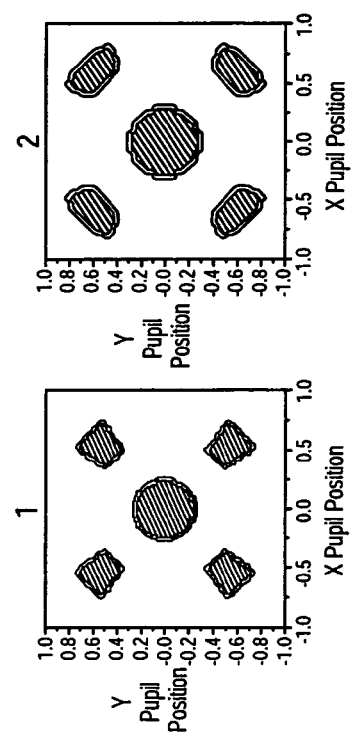
FIG. 8E
FIG. 8D
FIG. 8A

LITHOGRAPHIC APPARATUS AND DEVICE MANUFACTURING METHOD

PRIORITY AND BENEFIT INFORMATION

This application claims priority and benefit to U.S. Provisional Patent Application Ser. No. 60/617,211, entitled "Lithographic Apparatus And Device Manufacturing Method", filed on Oct. 12, 2004. The content of that application is incorporated herein in its entirety by reference.

BACKGROUND OF THE INVENTION

1. Field of the Invention

This invention relates to lithographic apparatus and methods.

2. Summary of the Related Art

A lithographic apparatus is a machine that applies a desired pattern onto a target portion of a substrate. Lithographic apparatus can be used, for example, in the manufacturing of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., including part of, one or several dies) on a substrate (e.g., a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the beam of radiation in a given direction (the "scanning"-direction) while synchronously scanning the substrate parallel or anti-parallel to this direction.

Photolithography is widely recognized as one of the key steps in the manufacturing of ICs and other devices and products with small features. However, as the dimensions of features become smaller, photolithography is becoming one of the most, if not the most, critical gating factors for enabling ICs and other devices and products with small features to be manufactured on a massive scale.

Fabrication of these ICs and other devices and products with small features involves the control of space tolerances between such small features, e.g., contact holes and interconnecting lines, as well as the control of the size of these features. The smallest space between two features and/or the smallest width of a feature such as, for example, a contact hole or an interconnecting line, is referred to as the critical dimension or CD. For an array of features, a pitch P of the periodicity may also be defined. The pitch refers to the mutual distance between two corresponding points of two substantially identical, neighboring features.

In order to control the critical dimension of these features during manufacturing, several lithographic responses may be used. These responses generally include the depth of focus (DOF), the exposure latitude (EL), the dense isolated bias (DIB), and the mask error enhancement factor (MEEF). The depth of focus is generally viewed as one of the most critical factors in determining the resolution of the lithographic apparatus. It is defined as the distance along the optical axis over which the image of the pattern is adequately sharp. The mathematical representation of DOF is:

$$DOF = +/- k_2 * \frac{\lambda}{NA^2} \quad (1)$$

where $k_2$ is an empirical constant, $\lambda$ is the wavelength of radiation user, and NA is the numerical aperture of the projection system used to make the feature. The exposure latitude describes the percentage dose range wherein the printed pattern's critical dimension (CD) is acceptable, typically 10%. It is used in combination with the DOF to determine the process window, i.e., the regions of focus and exposure that keep the final resist profile within prescribed specifications. As for the DIB, it is a measure of the size difference between similar features, depending on the pattern density. Finally, the MEEF describes how reticle CD errors are transmitted into substrate CD errors. This parameter corresponds to the incremental change in the final feature size on the substrate per unit change in the corresponding pattern feature size (where the pattern dimension is scaled to substrate size by the reduction ratio of the lithographic apparatus). Near the resolution limit of a lithographic apparatus, the MEEF often rises dramatically.

With increasing demands on the number of features per area of die to be printed, there have been tremendous efforts within the industry to lower the CD and the pitch of these features. Typically, the industry has used the Rayleigh criterion to provide a theoretical estimate of the limits of feature printing for a given process. The Rayleigh criterion for resolution CD is shown in equation (2):

$$CD = k_1 * \frac{\lambda}{NA} \quad (2)$$

where $\lambda$ is the wavelength of the radiation used, NA is the numerical aperture of the projection system used to image the feature, and $k_1$ is a process dependent adjustment factor, also called the Rayleigh constant. For conventional optical lithography, the ultimate resolution limit of conventional lithographic apparatus is reached at $k_1=0.5$, which corresponds to the state at which only one set of diffracted orders can pass through the projection system. The resolution limit of $k_1=0.5$ stands firm even as exposure wavelengths decrease from 248 nm to 193 nm and then to 157 nm, and numerical aperture increases from 0.5 to 0.75.

The effectiveness of a given lithographic process is generally weighed based on its capability to print arrays of dense features with sufficient latitude. However, any given photolithographic layer may also include small features that are positioned in one or more arrays at a pitch larger than the smallest distance between two features. Therefore, the printing of layers including small features occurring at both minimum pitch, i.e., dense features, and larger pitches, i.e., semi-dense features and isolated features, is of importance. Dense features are commonly known to be separated by a distance that is substantially equal to the target feature dimension, isolated features are commonly known to be separated by a distance that is more than about five times the target dimension, and semi-dense features are spaced apart by a distance ranging between about one and about five times the target feature dimension.

Thus, the printing of features arranged in the full pitch range may be complicated because the requirements for printing dense features generally differ from those for printing isolated features. Finding process conditions that simultaneously satisfy high depth of focus, low mask error enhancement factor, low sidelobe printing, and good pattern fidelity for dense, semi-dense and isolated features may be difficult and may become even more difficult as $k_1$ decreases below 0.4.

SUMMARY OF THE INVENTION

Embodiments of the invention include a method for transferring an image of a mask pattern through a pitch range onto a substrate. In an embodiment of the invention, the method includes illuminating the mask pattern of an attenuated phase shift mask using a multipole illumination that includes an on-axis component and an off-axis component, the mask pattern including non-printing assist features configured for a pitch larger than twice a minimum pitch of the mask pattern, and projecting an image of the illuminated mask pattern onto the substrate.

In another embodiment of the invention, there is provided a lithographic apparatus including an illumination system configured to provide a multipole illumination that includes an on-axis component and an off-axis component; a support structure configured to hold a patterning device, the patterning device being an attenuated phase shift mask configured to pattern the beam of radiation according to a desired mask pattern, the mask pattern including non-printing assist features configured for a pitch(s) larger than twice a minimum pitch of the mask pattern; a substrate table configured to hold a substrate, and a projection system configured to project the patterned beam of radiation onto the substrate.

In yet another embodiment of the invention, there is provided a device manufacturing method, including: conditioning a beam of radiation, the beam of radiation including an on-axis component and an off-axis component; patterning the beam of radiation with an attenuated phase shift mask to form a patterned beam of radiation, the attenuated phase shift mask including non-printing assist features that are configured for a pitch larger than twice a minimum pitch included in the mask; and projecting the patterned beam of radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2A depicts a schematic illustration of dense, semi-dense and isolated region of contact holes, the isolated region including non-printing assist features;

FIG. 2B depicts a schematic illumination configuration that may be used to print the regions of FIG. 2A with sufficient latitude;

FIGS. 8A-C show respectively the simulated variation of DOF@6% EL, MEEF and CD variation half range each as a function of pitch for the different illumination configurations shown in FIGS. 8D-F;

FIGS. 8D-F show multiple schematic illumination configurations including on and off axis components;

DETAILED DESCRIPTION OF THE INVENTION

Figure 1:
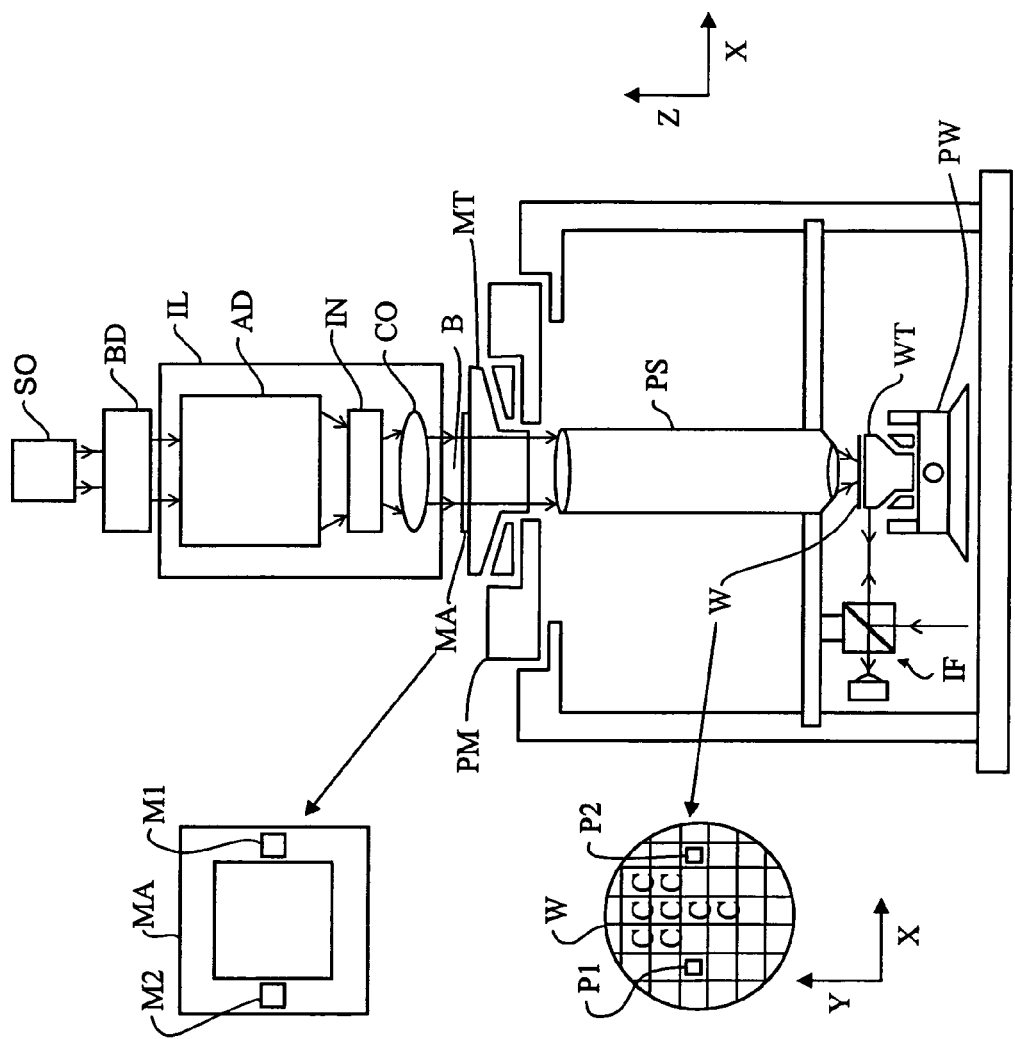
FIG. 1 depicts a schematic illustration of a lithographic apparatus in accordance with an embodiment of the invention.

FIG. 1 schematically depicts a lithographic apparatus according to an embodiment of the invention. The apparatus includes an illumination system (illuminator) IL adapted to condition a beam B of radiation (e.g., UV radiation) and a support structure (e.g., a mask table) MT configured to hold a patterning device (e.g., a mask) MA and connected to a first positioning device PM configured to accurately position the patterning device with respect to the projection system PS (e.g., a projection lens). The apparatus also includes a substrate table (e.g., a wafer table) WT configured to hold a substrate W (e.g., a resist-coated wafer) and connected to a second positioning device PW configured to accurately position the substrate with respect to the projection system PS. The apparatus also includes the projection system PS (e.g., a refractive projection lens) adapted to image a pattern imparted to the beam B by the patterning device MA onto a target portion C (e.g., including one or more dies) of the substrate W.

As depicted here, the apparatus is of a transmissive type (e.g., employing a transmissive mask). Alternatively, the apparatus may be of a reflective type (e.g., employing a programmable mirror array of a type as referred to below or a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD, including for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation B.

The beam of radiation B is incident on the patterning device MA, which is held on the support structure MT. Having traversed the patterning device MA, the beam of radiation B passes through the projection system PS, which focuses the beam onto a target portion C of the substrate W. With the aid of the second positioning device PW and position sensor IF (e.g., an interferometric device), the substrate table WT can be moved accurately, e.g., so as to position different target portions C in the path of the beam B. Similarly, the first positioning device PM and another position sensor (which is not explicitly depicted in FIG. 1) can be used to accurately position the patterning device MA with respect to the path of the beam B, e.g., after mechanical retrieval from a mask library, or during a scan. In general, movement of the support structure MT and the substrate table WT will be realized with the aid of a long-stroke module (coarse positioning) and a short-stroke module (fine positioning), which form part of one or both of the positioning devices PM and PW. However, in the case of a stepper (as opposed to a scanner) the support structure MT may be connected to a short stroke actuator only or may be fixed. Patterning device MA and substrate W may be aligned using patterning device alignment marks M1, M2 and substrate alignment marks P1, P2.

The depicted apparatus may be used in the following preferred modes:

1. In step mode, the support structure MT and the substrate table WT are kept essentially stationary, while an entire pattern imparted to the beam of radiation is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam of radiation is projected onto a target portion C (i.e., a single dynamic exposure). The velocity and direction of the substrate table WT relative to the support structure MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations of the above described modes of use or entirely different modes of use may also be employed.

The resolution limit of a lithographic projection apparatus may be optimized by the control of the relative size of the illuminator numerical aperture ($NA_{ill}$). Control of $NA_{ill}$ with respect to the projection system's numerical aperture ($NA_{ps}$) allows for modification of spatial coherence at the patterning device (mask) plane, commonly referred to as partial coherence σ, where:

$$\sigma = (NA_{ill})/(NA_{ps})$$

This is typically accomplished through specification of the condenser lens pupil in a Köhler illumination system. Essentially, this allows for manipulation of the optical processing of diffraction information. Optimization of the partial coherence of a projection imaging system is conventionally accomplished using full circular illumination apertures (conventional or sigma illumination configuration). By controlling the distribution of diffraction information in the projection system with the illuminator pupil size, maximum image modulation may be obtained.

A system where illumination is obliquely incident on the mask at an angle so that the zero-th and first diffraction orders are distributed on alternative sides of the optical axis may allow for improvements of the image resolution. Such an approach is generally referred to as off-axis illumination. Off-axis illumination improves resolution by illuminating the mask with radiation that is at an angle to the optical axis of the projector system. The incidence of the radiation on the mask, which acts as a diffraction grating, improves the contrast of the image by transmitting more of the diffracted orders through the projector system. Off-axis illumination techniques used with conventional masks produce resolution enhancement effects similar to resolution enhancement effects obtained with phase shifting masks.

A first approach for printing small features through the full pitch range is to use off-axis illumination in combination with a binary mask (BIM) and assist features. Assist features are elements that are placed on the patterning device next to isolated or semi-isolated features enabling such isolated or semi-isolated features (such as gate lines or contact holes) to image more like dense features, so that the depth of focus of the isolated features are improved. Assist features are dimensioned such that they do not print on the substrate during exposure. They are below the resolution limit of the lithographic apparatus. Assist features may be used as an effective technique for enhancing the process window. Generally, they are generated during creation of the electronic file of the ICs.

Examples of assist features include scattering bars and anti-scattering bars. Scattering bars are small lines that have the same transparency as the feature around which they are disposed, and have dimensions that are less than the resolution limit of the lithographic apparatus. Anti-scattering bars are openings that may be used to improve the resolution of small features, such as, for example, small contact holes. They serve a dual purpose. First, they increase the intensity of radiation that is transferred onto the substrate so that the intensity level of small features may match that of larger features. Second, they increase the intensity level of the feature, thereby enhancing the depth of focus.

Several parameters may govern the application of these scattering and anti-scattering bars: the width of the bars, the separation of the bars from the edge of the main feature (e.g., gate line or contact hole), and the number of scattering or anti-scattering bars on each side of the main feature. Using scattering and anti-scattering bars, it may be possible to make isolated and semi-isolated features achieve performance comparable to dense features.

Referring to FIG. 2A, this figure shows several arrays (square grids) of contact holes that are arranged in various pitches. These arrays correspond to a dense, a semi-dense and an isolated region. In the dense region of FIG. 2A, the pitch is substantially equal to twice the critical dimension of the contact holes. The dense pitch is the minimum pitch used in the design of ICs and is generally in the range between about one and a half and three times the critical dimension of the contact holes. The pitch of an isolated region is generally, at least, twice this range, i.e., from between three and six times the target hole size to "infinity." In the isolated region of FIG. 2A, the isolated pitch is about five times the critical dimension of the contact holes. The semi-dense region is the region where the pitch is greater than the dense pitch and smaller than the isolated region. In FIG. 2A, the pitch is about three times the critical dimension of the contact holes. The isolated region includes anti-scattering bars that are disposed along the edge of each contact hole and in the area that separates adjacent contact holes. These anti-scattering bars may be arranged in substantially the same pitch as that of the dense region. That is, the distance separating two consecutive bars may be about the same as the distance separating two contact holes in the dense region. In this configuration, anti-scattering bars densify the pattern for isolated contact holes. Because isolated regions print like dense regions with the use of assist features, optimization of the lithographic process (in terms of source shape, NA, bias, type of mask) can focus on the dense and semi-dense regions.

A patterning device including these arrays of features may be used in combination with a multipole illumination in order to print contact holes with sufficient process latitude. This patterning device may be a binary mask or a chrome mask. FIG. 2B shows a cross section of a multipole illumination that may be used to print the full range of pitches. This multipole illumination is a cross section of the radiation in the pupil plane of the illuminator. This multipole illumination, includes four off-axis poles that are positioned at substantially +/−45° relative to the horizontal axis. These poles have an inner radius of about 0.6 and an outer radius of about 0.96 relative to the full illuminator aperture, i.e., 1. Both dense and semi dense regions may be printed with sufficient latitude as the difference between the inner and outer radii of the poles increases. Experiments have shown that poles centered at large radii may be useful to print contact holes on a dense square grid, while more moderate radii may be desirable for semi-dense contact holes. With the off axis poles of FIG. 2B, the largest portion of the poles, i.e., the outer periphery of the poles, are useful to print the dense square grid, whereas the smaller portion of these poles, i.e., the inner periphery of the poles, is useful to print the semi-dense square grids. This multipole off-axis illumination has been calculated with a PROLITH 8.01 imaging simulation tool developed by KLA-Tencor.

As shown in FIG. 2B, these poles also have an opening angle. Generally, large opening angles increase the pupil fill, which may extend the lifetime of the projection system, and reduce lens heating effects. Large opening angles may also be useful for printing a wider range of feature types, and may reduce coherence effects which can affect pattern fidelity in some cases.

Creation of the illumination configuration shown in FIG. 2B may be done with conventional beam shapers. U.S. Pat. No. 6,452,662 discloses, for example, a multimode generating element that may be used to generate this type of illumination. The content of that application is incorporated herein in its entirety by reference. The multipole generating element, disclosed in that application, includes four triangular blades insertable into the beam path at the pupil plane of the illumination system (illuminator). This multimode generating element enables continuously variable quadrupole illumination configurations to be produced. In another embodiment, a metal aperture plate filter could be used to create the desired illumination configuration.

A second approach for printing small features through the full pitch range is to use a multipole illumination, including on and off axis components, in combination with an attenuated phase shift mask (att-PSM). Attenuated phase shift masks (Att-PSM) are fabricated by replacing the opaque part of a conventional mask with a halftone film—one that is partially transmissive. The transmissivity of such a halftone film is generally on the order of about 10% transmission. The halftone film is chosen to desirably shift the phase of the radiation it transmits by 180 degrees. The radiation which passes through the clear area of the phase shift mask, in contrast, is not phase shifted. In this manner, destructive interference occurs between some diffracted waves which can be beneficial for imaging. In such an approach, the off-axis illumination may be used to favorably image the dense pitches while the on-axis component and the attenuated phase shift mask may be used to image isolated features.

Figure 3A:
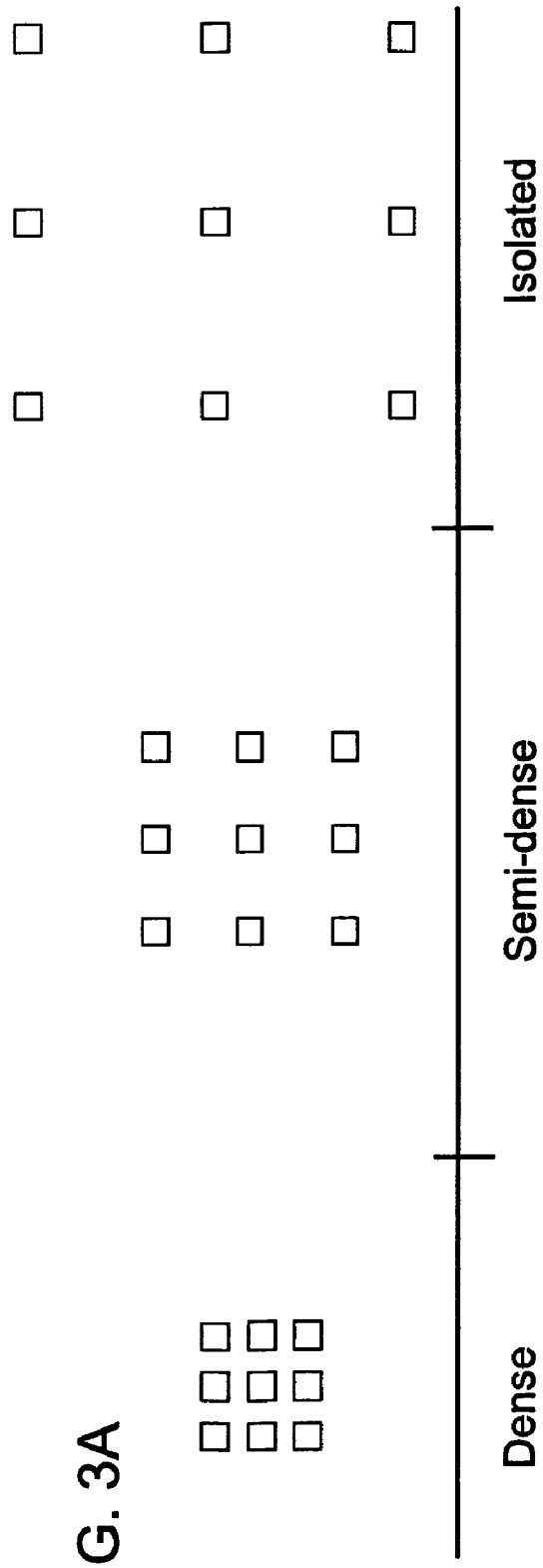
FIG. 3A depicts a schematic illustration of dense, semi-dense and isolated region of contact holes.
Figure 3B:
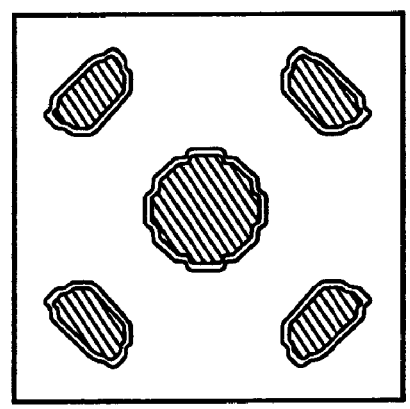
FIG. 3B depicts a schematic illumination configuration that may be used to print the regions of FIG. 3A with sufficient latitude.

FIG. 3A shows various arrays of contact holes that are arranged in several pitches. These dense, semi-dense and isolated grids of contact holes may be good representatives of the various features that are generally included in a lithographic level. In this second approach, anti-scattering bars have been omitted in the isolated region. Imaging of the isolated region may be done with the aid of the on-axis illumination and the attenuated phase shift mask. A cross-section of the multipole illumination that may be used to successfully print the full range of pitches is shown in FIG. 3B. This illumination is a cross section of the radiation in the pupil plane of the illuminator. The off-axis poles are arranged at +/−45° relative to the horizontal axis. Similarly to FIG. 2B, these poles have a position and size so that they can successfully image both dense regions and semi-dense regions.

Optimization of the illumination configuration shown in FIG. 3B or in FIG. 2B may be done by computer simulation. Examples of simulation models and methods to optimize a parameterized illumination configuration may be gleaned from, for example, U.S. patent application Ser. No. 10/361, 831, filed on Feb. 11, 2003, entitled "Method for Optimizing an Illumination Source Using Full Resist Simulation and Process Window Metric," and U.S. patent application Ser. No. 10/716,439, filed on Nov. 20, 2003, entitled "Lithographic Apparatus and Method for Optimizing an Illumination Source Using Isofocal Compensation." The contents of these two applications are incorporated herein in their entirety by reference.

As disclosed in these two patent applications, optimization of the illumination configuration includes several acts.

First, the beam of radiation in the pupil plane of the illuminator may be divided into a plurality of source points. In practice, the grid of source points may be defined by an illumination file that includes the spatial coordinates of each source point contained in the grid. The physical location of each source point relative to the full illuminator aperture may be varied depending on the degree of accuracy desired. A small spacing between each light source point may provide more detailed information about the source response but may increase the calculation time. Conversely, a large spacing between each source point may provide less accurate information about the source response but may decrease the calculation time. In an embodiment, the spacing of the grid relative to the full illuminator aperture is approximately 0.1. In other embodiments, the grid spacing is approximately 0.01 to 0.2.

Second, a lithographic response for each source point may be calculated. In practice, an image of the pattern may be calculated for each source point and this image may be evaluated versus one or more criteria to judge whether the image has appropriate optical qualities to successfully print the desired pattern on the substrate. The procedure can be performed iteratively to arrive at the optimal value of the lithographic response. The image can be analyzed, for example, through a focus range to provide estimates of the exposure latitude and depth of focus. Additional lithographic responses that may be determined for each source point include: critical dimension of the pattern studied, intensity threshold necessary to define the target critical dimension (CD) on the substrate, depth of focus at 8% EL (DOF@8% EL), exposure latitude, dose-to-size $E_{1:1}$, dense to isolated feature bias, arbitrary feature size biases, sidelobe printing, film loss, sidewall angle, mask error enhancement factor (MEEF), linear resolution, absolute resolution, or critical dimension uniformity.

Calculation of the lithographic response for each source point may be done by simulation. Generally, simulations may be performed with an aerial image model in order to determine the incident radiation energy distribution onto the radiation sensitive material (resist). Calculation of the aerial image may be performed either in the scalar or vector form of the Fourier optics. Characteristics of the lithographic apparatus and process, like the numerical aperture (NA) or the specific pattern, may be entered as input parameters for the simulation. The quality of the aerial image may be determined by using a contrast or normalized aerial image log-slope (NILS) metric (normalized to the feature size). This value corresponds to the slope of the image intensity (or aerial image).

Relevant parameters to perform the aerial image simulation may include the distance from the focal plane of the Gaussian image plane, meaning the distance to the plane where the best plane of focus exists, as determined by geometrical ray optics, or the center wavelength of the quasi-monochromatic radiation source. The parameters may also include a measure of degree of spatial partial coherence of the illumination system, the numerical aperture of the projection system exposing the substrate, the aberrations of the optical system and a description of the spatial transmission function representing the pattern.

The lithographic simulation may be performed with a resist model. In an implementation, the resist model may take into account, in the calculation of the critical dimension (or size) and its variation with variables such as dose/exposure energy and focus, the resist exposure, the resist baking and the resist developing. Likewise, the resist model may take into account, in an embodiment, a nonplanar topography and vector effects. The vector effects refer to the fact that an electromagnetic wave propagates obliquely when a high numerical aperture is used. Although vector effects can be accounted for when calculating the aerial image, a calculation of the vector effects in a low refractive index medium (e.g., in air) may greatly overestimate the contrast loss obtained on the substrate because the incident rays tend to be straightened when they propagate in the resist because of the resist's higher refractive index. Therefore, a resist model with a rigorous electromagnetic calculation may be desirable to accurately determine the actual experimental response.

Additional models like a lumped parameter model or a variable threshold resist model may also be used in other embodiments. It will be appreciated that the simulation model is selected because it matches experimental data.

Third, the shape of the illumination beam may be determined based on the analysis of the separate lithographic responses.

The procedure for optimizing the best conditions of illumination (source shape and mask bias) is performed iteratively. In practice, a candidate source shape and a mask bias are selected and tested in the simulator and then iteratively adjusted to get a high process latitude (i.e., optimized value for each lithographic response) with, for example, acceptable sidelobing. An iterative fitting algorithm may be used to cycle through the initial lithographic parameters that define the candidate source in order to optimize that source shape.

In order to qualitatively determine the candidate source shape, or illumination configuration, calculation results of selected lithographic responses may be visualized on contour maps. These contour maps show the values of lithographic responses as a function of source point location.

Referring to FIGS. 4A-E, these figures show contour maps obtained by simulation with a PROLITH version 8.01 imaging simulation tool. The lithographic response studied is the depth of focus at 8% of exposure latitude (DOF@8% EL). Calculations were done for arrays of 80 nm contact holes arranged in various pitches (160 nm/FIG. 4A; 200 nm/FIG. 4B; 240 nm/FIG. 4C; 300 nm/FIG. 4D; 600 nm/FIG. 4E) with a 20 nm mask bias, and for a 6% attenuated phase shift mask, a 157 nm radiation wavelength, and a 0.85 numerical aperture. Optimization of the illumination source is performed in accordance with the second approach (five pole illumination with attenuated phase shift mask). Therefore, no assist features have been placed on the phase shift mask. The source point grid has a 0.1:0.1 spacing relative to the full illuminator aperture. For symmetry reasons, only the upper right hand of the illuminator needs be visualized. As shown in FIGS. 4A-E, a plurality of illumination shapes are determined to image the printing features on the substrate at the different pitches of the pitch range so that, for each of the different pitches of the pitch range, an illumination shape that is suitable to image the printing features on the substrate is determined. As shown in FIG. 4F, a multipole illumination to be used to illuminate the mask pattern is determined based on the plurality of illumination shapes obtained for the different pitches of the pitch range.

Figure 4A:
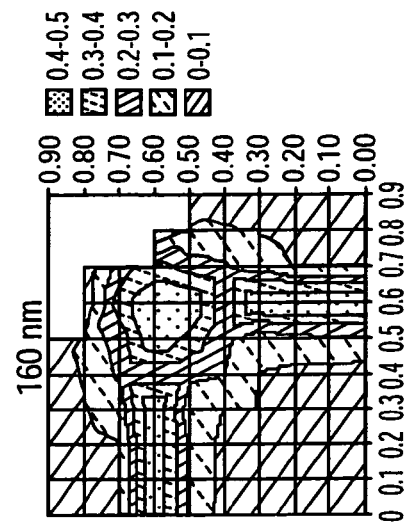
FIGS. 4A-E show simulated contour maps that may be used to optimize an illumination configuration.
Figure 4C:
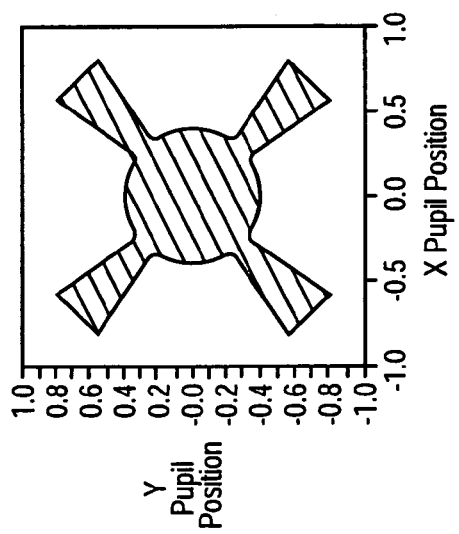
Figure 4E:
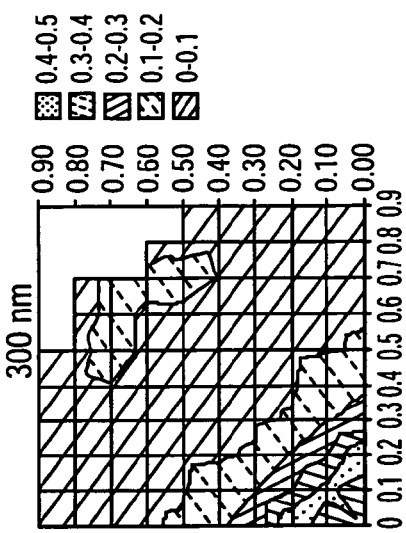
Figure 4B:
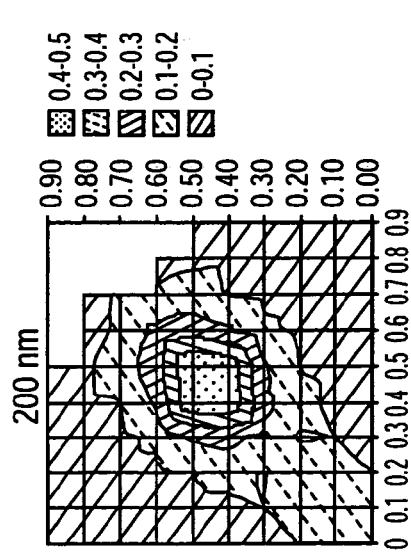
Figure 4F:
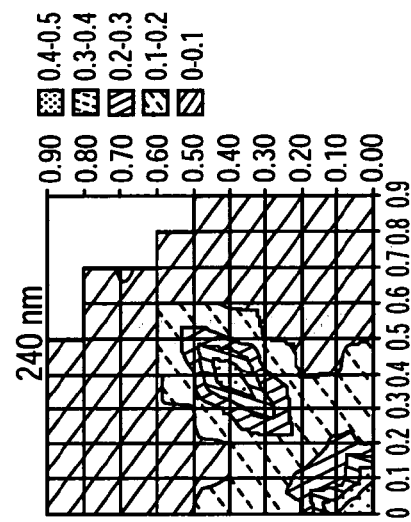
FIG. 4F shows a schematic optimized illumination configuration that may be used to print the regions shown in FIG. 3A.
Figure 4D:
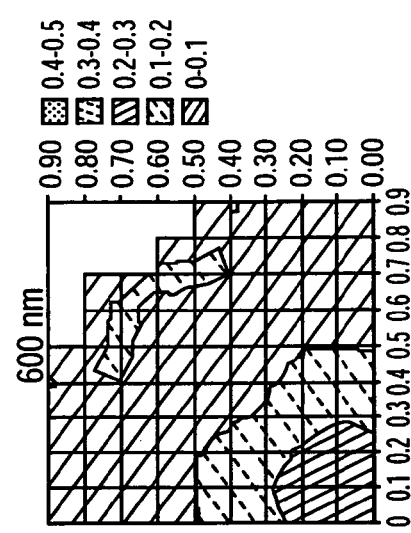

As can be seen in FIGS. 4A-B, off-axis source points located proximate the center of the source maps have a significant contribution to a greater value of the depth of focus at 8% of exposure latitude for small pitches (i.e., pitches smaller than 200 nm). These source points define an off-axis pole that is located at about 45° relative to the horizontal axis and is centered at approximate coordinates (0.5,0.5). Thus, as shown in FIG. 4A, source points located between approximate coordinates (0.5,0.5) and (0.6,0.6) have a significant contribution to a greater value of depth of focus at 8% of exposure latitude for a 160 nm pitch. Furthermore, as shown in FIG. 4B, source points located between approximate coordinates (0.4,0.4) and (0.5,0.5) have a considerable contribution to a greater value of depth of focus at 8% of exposure latitude for a 200 nm pitch.

However, as the pitch value increases, source points located closer to the origin (0,0) may contribute to a favorable value of DOF@% 8EL. FIG. 4C shows, for example, that the on-axis region tends to bridge the off-axis region for a 240 nm pitch. As can be seen in FIG. 4E, favorable illumination for a 600 nm pitch may only be generated with an on-axis pole having an outer radius lower than 0.25, since source points located outside that pole contribute to an unacceptable low value of DOF@% 8EL. The results shown in FIGS. 4A-E indicate that dense pitches need off-axis illumination while loose pitches need low sigma illumination. It follows that an illumination configuration (candidate source shape) combining on and off-axis poles may be beneficial to print arrays of contact holes arranged in various pitches. The optimum illumination configuration is shown in FIG. 4F.

Figure 5B:
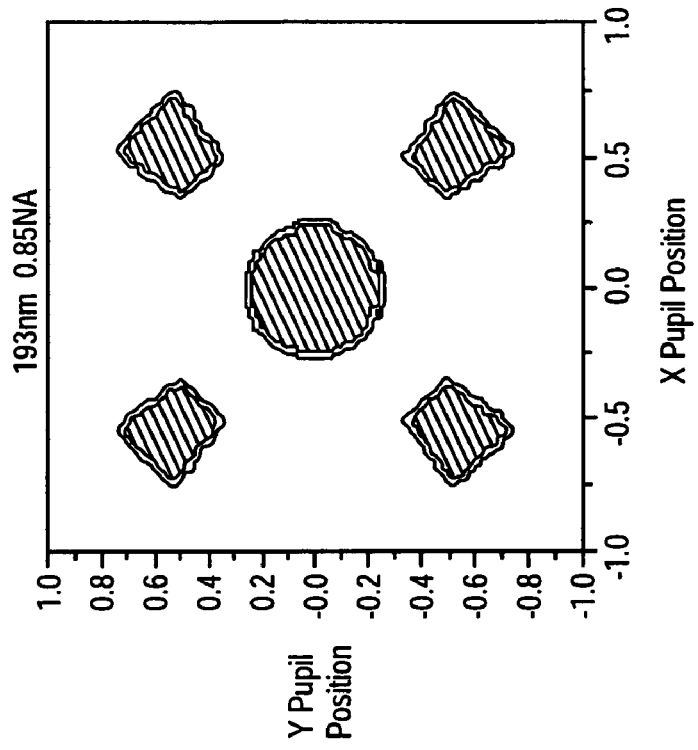
FIGS. 5A-B show two schematic illumination configurations optimized (for different mask assumptions) to print arrays of 120 nm contact holes arranged in various pitches.
Figure 5A:
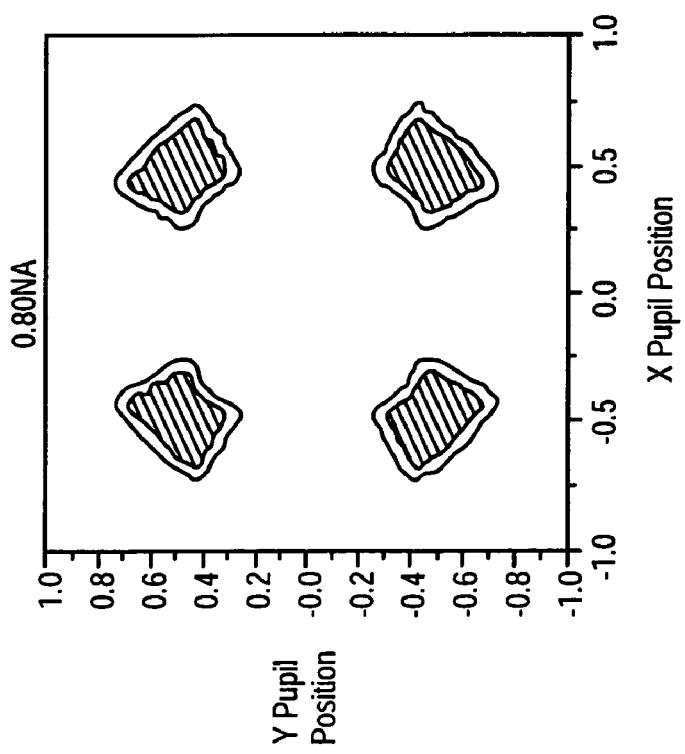

FIGS. 5A-B show two schematic illumination configurations that are optimized to print arrays of 120 nm contact holes arranged in various pitches in accordance with the first and the second approaches, respectively. As mentioned previously, the first approach for printing small features through the full pitch range consists of using off-axis illumination in combination with a binary mask (BIM) and assist features. The second approach for printing small features through the full pitch range consists of using a multipole illumination, including on and off axis components, in combination with an attenuated phase shift mask (att-PSM). Optimization of these illumination configurations may be done in a similar manner as that of FIG. 4F.

FIG. 5A shows that an optimum illumination configuration for the first approach, i.e., an approach combining a binary mask, an off-axis illumination and assist features for large pitches, includes off-axis poles arranged at about +/−45° relative to the horizontal axis. These poles have a 30° opening angle, a 0.83 outer radius, and a 0.54 inner radius. In an embodiment, the illumination is projected onto a substrate using a 0.80 NA projection system. FIG. 5B shows an optimum illumination configuration for the second approach, i.e., an approach combining an attenuated phase shift mask and on and off-axis illumination, including a 0.25 sigma illumination and off-axis poles arranged at about +/−45° relative to the horizontal axis. In FIG. 5B the attenuation of the phase shift mask is about 6%. The off-axis poles of FIG. 5B have a 20° opening angle, a 0.9 outer radius, and a 0.6 inner radius. In an embodiment, the illumination has a wavelength of 193 nm and is projected onto a substrate using a 0.85 NA projection system.

Figure 6B:
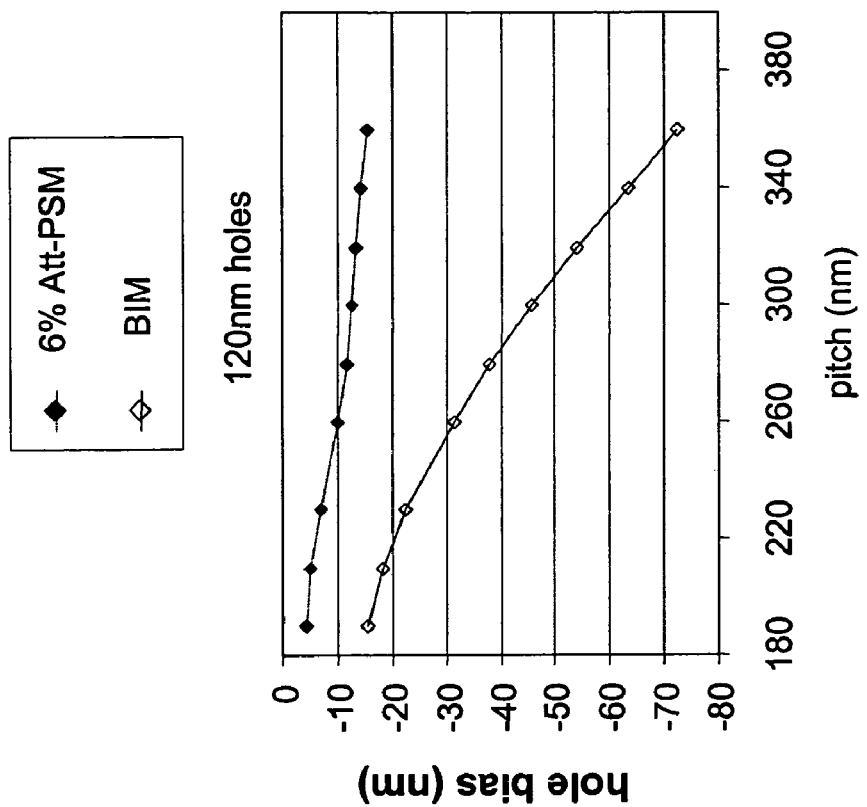
FIG. 6B shows the simulated variation of mask bias as a function of pitch obtained with the illumination configurations of FIGS. 5A-B.
Figure 6A:
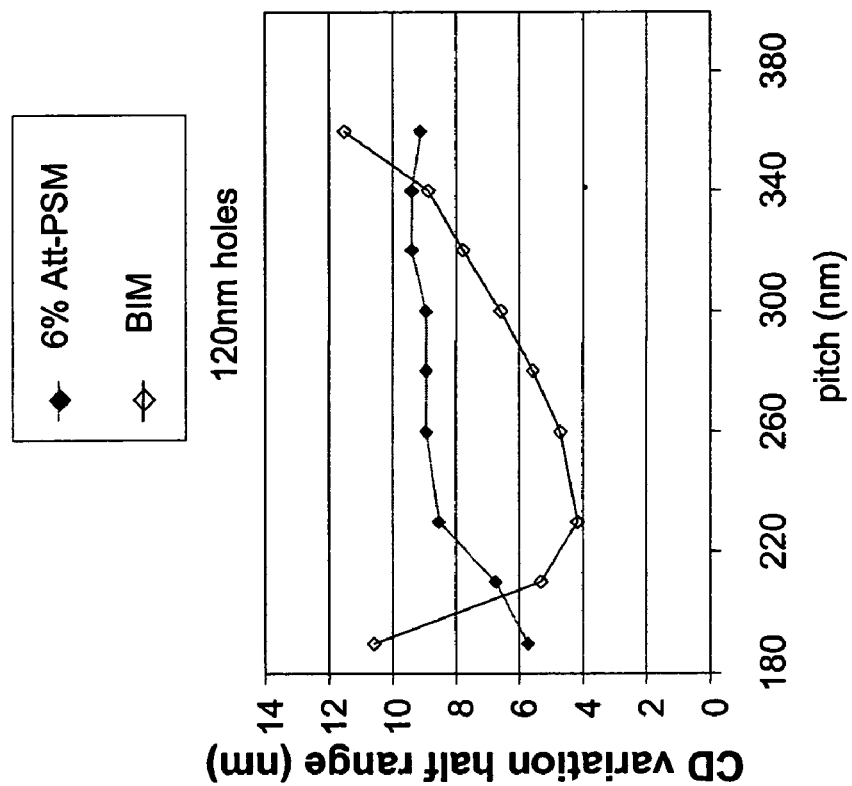
FIG. 6A shows simulated CD variation half range as a function of pitch obtained with the illumination configurations of FIGS. 5A-B.

Referring now to FIGS. 6A-B, these figures show respectively the simulated critical dimension variation half range as a function of pitch, using the required biases, for the illumination configurations of FIGS. 5A-B. In FIG. 6A, the 190-360 nm pitch range may be considered critical since there is no room for assist features (e.g., ASBs) in that range. Calculations were done for a 0.25 µm focus range, a 3% dose range and a 4 nm reticle range (substrate scale). As can be seen in FIG. 6A, the illumination configuration of FIG. 5B (second approach) has a flatter response and a lower maximum CD variation than the illumination configuration of FIG. 5A. FIG. 6A also shows that the illumination configuration of FIG. 5A (first approach) gives a lower CD variation and may be desirable if the extreme pitches considered in FIG. 6A are excluded (forbidden compromise in this embodiment). However, referring to FIG. 6B, the binary mask used with the illumination configuration of FIG. 5A may require very large mask biases for relaxed pitches.

Figure 7B:
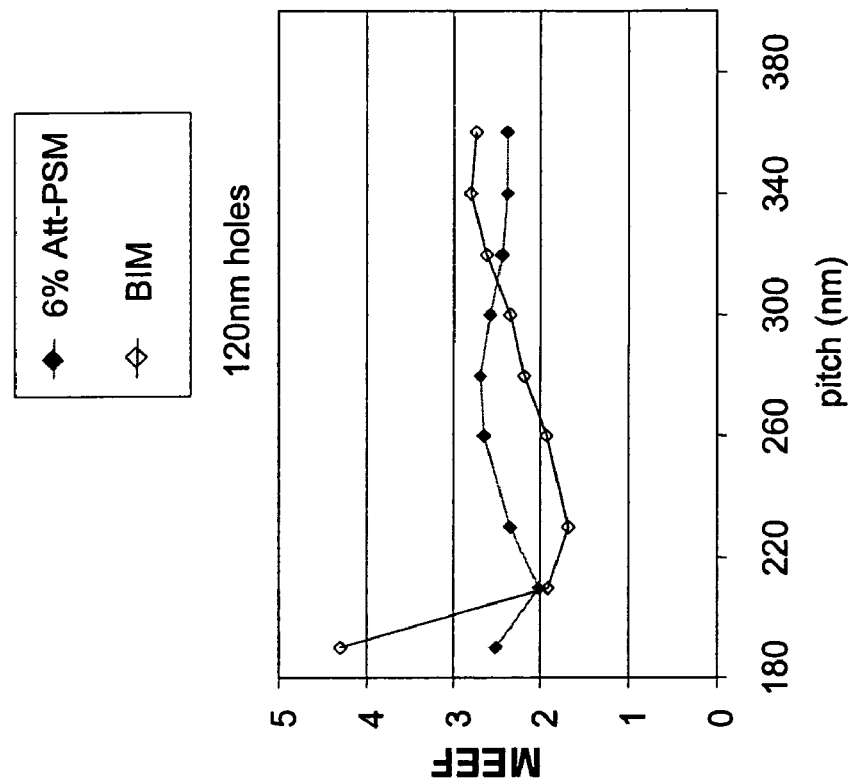
FIGS. 7A-B show respectively the schematic variation of depth of focus at 6% of exposure latitude and mask error enhancement factor each as a function of pitch for the illumination configurations of FIGS. 5A-B.
Figure 7A:
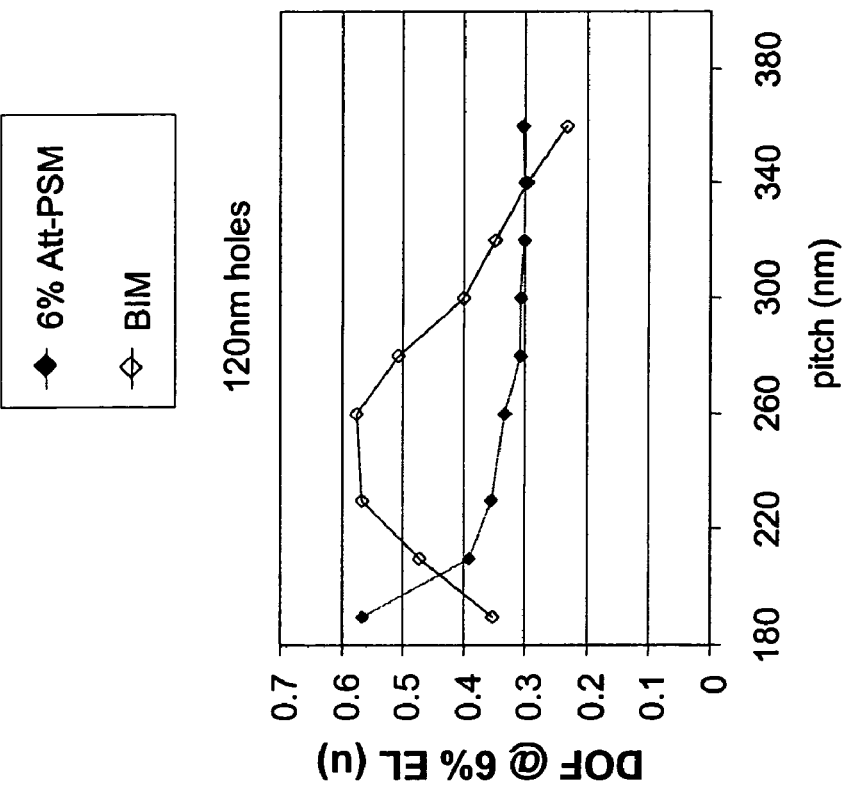

FIGS. 7A-B show respectively the simulated variation of depth of focus at 6% of exposure latitude (DOF@6% EL) and mask error enhancement factor (MEEF) as a function of pitch for the illumination configurations of FIGS. 5A-B. These lithographic responses dominate the errors in the process. As can be seen in these two figures, the first approach, which uses the illumination configuration of FIG. 5A, finds an optimum condition which trades off dense and "relaxed" pitch performance. Furthermore, the second approach, which uses the illumination configuration of FIG. 5B in combination with a 6% attenuated phase shift mask, has a lower MEEF variation through the entire pitch range than the first approach.

Referring to FIGS. 8A-C, these figures show respectively the simulated values for DOF@6% EL, MEEF and CD variation half range as a function of pitch for three different schematic illumination configurations shown in FIGS. 8D-F. These results are obtained in accordance with the second approach, i.e., an illumination configuration having on and off-axis components used in combination with an attenuated phase shift mask (6% attenuation). Calculations are done for 120 nm contact holes with a 0.8 numerical aperture, a 193 nm radiation, a 30 mJ/cm$^2$ exposure dose, and a fine mask biasing. The size of the sigma illumination and the off-axis poles has been changed in FIGS. 8D-F from FIG. 5B. FIG. 8D (illumination configuration 1) includes a 0.25 sigma illumination, and off-axis poles having a 20° opening angle, a 0.9 outer radius and a 0.6 inner radius. FIG. 8E (illumination configuration 2) includes a 0.3 sigma illumination, and off-axis poles having a 30° opening angle, a 0.95 outer radius and a 0.7 inner radius. Finally, FIG. 8F (illumination configuration 3) includes a 0.25 sigma illumination, and off-axis poles having an inner and outer component. The inner component of the poles has a 20° opening angle, a 0.7 inner radius and a 0.9 outer radius. The outer component of the poles extends from the inner component and has a 45° opening angle, a 0.9 inner radius and a 0.97 outer radius. The results shown in FIGS. 8A-C indicate that appropriate multipole illumination, which includes an on-axis component and off-axis poles arranged at about +/−45° relative to the horizontal axis of the illuminator, may give reasonable performance through the entire pitch range. In particular, FIG. 8B shows that MEEF results are about the same for the different illumination configurations of FIGS. 8D-F. However, FIGS. 8A and 8C indicate that the illumination configurations of FIGS. 8E-F may produce better depth of focus at 6% of exposure latitude and lower CD variation half range through the full pitch range than the illumination configuration of FIG. 8D.

A comparison of the first and second approaches discussed above indicates that off-axis illumination in combination with a binary mask and assist features for isolated features (first approach) may be deficient at extreme pitches (dense and isolated pitch). The first approach may however provide better imaging performances for intermediary pitches (i.e., situation where extreme pitches are excluded). The second approach may be a good candidate for imaging patterns through the entire pitch range. In particular, the use of on-axis illumination and an attenuated phase shift mask may be beneficial at extreme pitches. However, sidelobe printing may occur for some pitches.

Sidelobe printing can occur with attenuated phase shift masks exposed with high doses (i.e., low biases). Sidelobes are unwanted images in the final pattern caused by constructive interference between adjacent clear features in the mask pattern when the adjacent clear features are closely spaced and are separated by a distance on the order of the radiation wavelength. They typically appear as spurious windows or ring structures in dense patterns, and are highly sensitive to pattern details (e.g., pitch) and optical conditions (e.g., source shape and numerical aperture). Sidelobe printing may be most problematic for hole patterns with pitches near 1.2*λ/

NA (where λ is the radiation wavelength and NA is the numerical aperture of the lithographic apparatus), with small pattern bias (i.e., relatively high printing dose) and where high transmission masks are used. It may also be most problematic for 193 nm lithography, where current radiation sensitive materials may not have sufficient surface inhibition to prevent sidelobe formation. Sidelobe printing may drastically affect manufacturing yield since unwanted additional features in the pattern may be transferred into the substrate.

In order to reduce sidelobe printing and to provide good imaging performance for the entire pitch range, in an embodiment that consists of a third approach, a multipole illumination configuration including on and off-axis components is combined with an attenuated phase shift mask and assist features (e.g., anti-scattering bars). Sidelobe printing may be reduced because the presence of assist features may provide better depth of focus for isolated patterns, thereby allowing smaller size on-axis illumination (smaller central pole). Furthermore, the illumination/global bias optimization may focus on dense pitches. This imaging solution may be beneficial for printing random hole patterns where the addition of assist features (e.g., anti-scattering bars) may sometimes be difficult or impossible. In particular, the number of assist features needed for a random pattern may be much less than for the first approach described above.

Figure 9B:
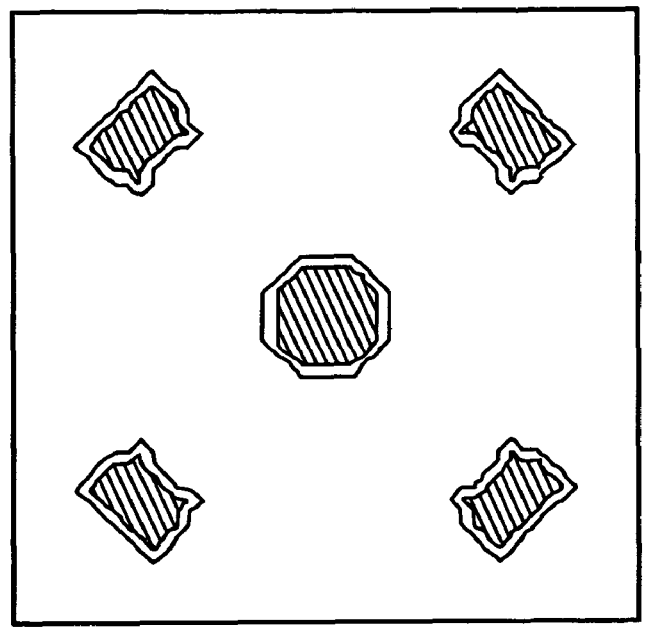
FIGS. 9A-B show two schematic illumination configurations that may be used to print features through the entire pitch range.
Figure 9A:
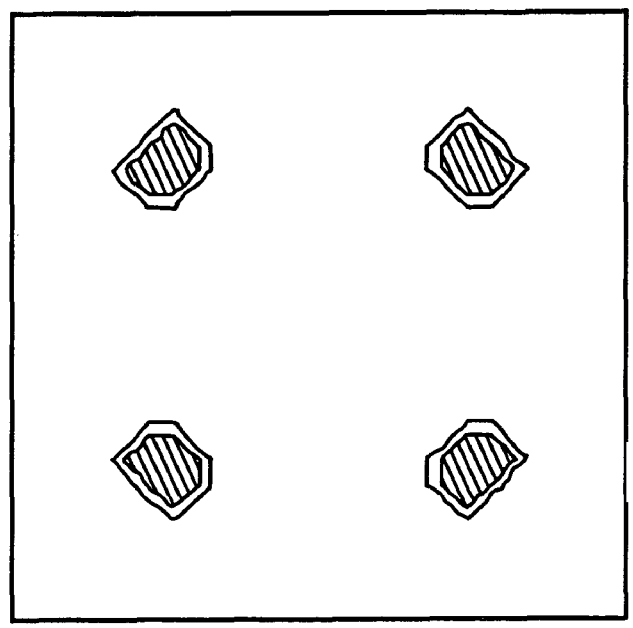

FIGS. 9A-B show two schematic illumination configurations that are designed to print arrays of 80 nm contact holes through the entire 160 nm-1000 nm pitch range at 193 nm. FIG. 9A shows an illumination configuration optimized corresponding to the method of the first approach and FIG. 9B represents an illumination configuration that corresponds to the third approach. In this embodiment, a multipole illumination configuration including on and off-axis components is used to illuminate an attenuated phase shift mask that contains assist features (e.g., anti-scattering bars). Optimization of the illumination configurations is done for a 0.15 μm focus range, a 2% dose range and 3 nm mask error. Minimization of a critical dimension variation metric (which approximates CD uniformity or CDU) and a PROLITH 8.01 simulation tool including a calibrated resist and a vector image model were used for simulation of these illumination configurations. The CDU is representative of contact hole CD variations due to several parameters. In the present case, the CDU corresponds to the quadratic sum of CD variations due to dose, focus and mask errors. Additional parameters such as lens aberrations may also be used. Optimization of these two illumination configurations may be done via an iterative optimization procedure, as explained previously.

As can be seen in FIG. 9A, the illumination configuration of the first approach includes off-axis poles having a 20° opening angle, a 0.6 inner radius, and 0.8 outer radius. FIG. 9B shows that the illumination configuration of the third approach includes a multipole illumination having a 0.2 central pole and off-axis poles that are defined by a 20° opening angle, a 0.74 inner radius, and a 0.96 outer radius. In an embodiment of the illumination configuration of FIG. 9B, an inner radius of the off-axis poles may have a normalized value between about 0.7 and 0.8, an outer radius of the off-axis poles may have a normalized value between about 0.8 and 1 and a radius of the on-axis pole has a normalized value between 0.1 and 0.4. The illumination configuration of FIG. 9B is used to illuminate a 6% attenuated phase shift mask.

Figure 10B:
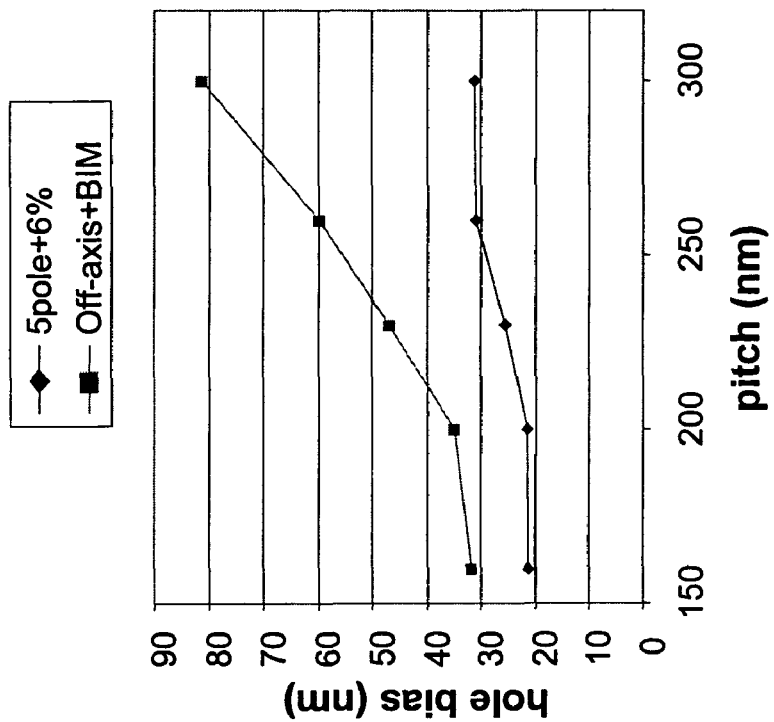
FIGS. 10A-B show respectively simulated critical dimension variation half range and hole bias variation each as a function of pitch for the illumination configurations of FIGS. 9A-B.
Figure 10A:
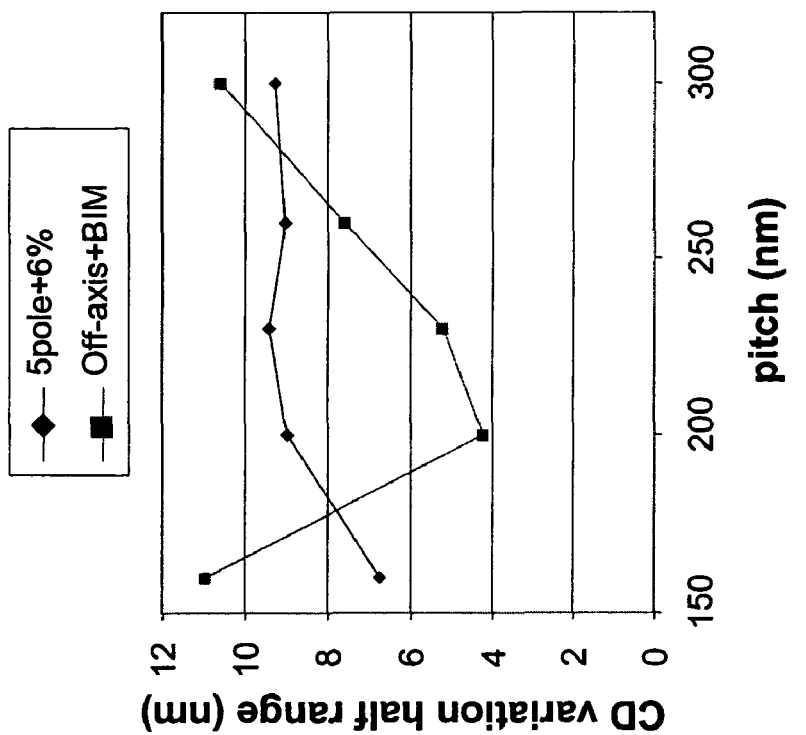

FIGS. 10A-B show the CD variation half pitch and the associated bias as a function of pitch for the illuminations of FIGS. 9A-B. Results are given for arrays of 80 nm contact holes. Referring now to FIG. 10A, this figure shows that the third approach has a lower simulated maximum CD variation, i.e. will give best CDU on the wafer. The CD variation half range with the third approach has a relatively flat profile. By contrast, and as previously shown in FIG. 6A, the first approach produces an unacceptably high CD variation for the extreme pitches: 160 nm and 300 nm. FIG. 10B shows the corresponding simulated mask biasing that is used with the first and third approaches. As can be seen in this figure, the first approach requires very high hole biases for looser pitches.

Figure 11:
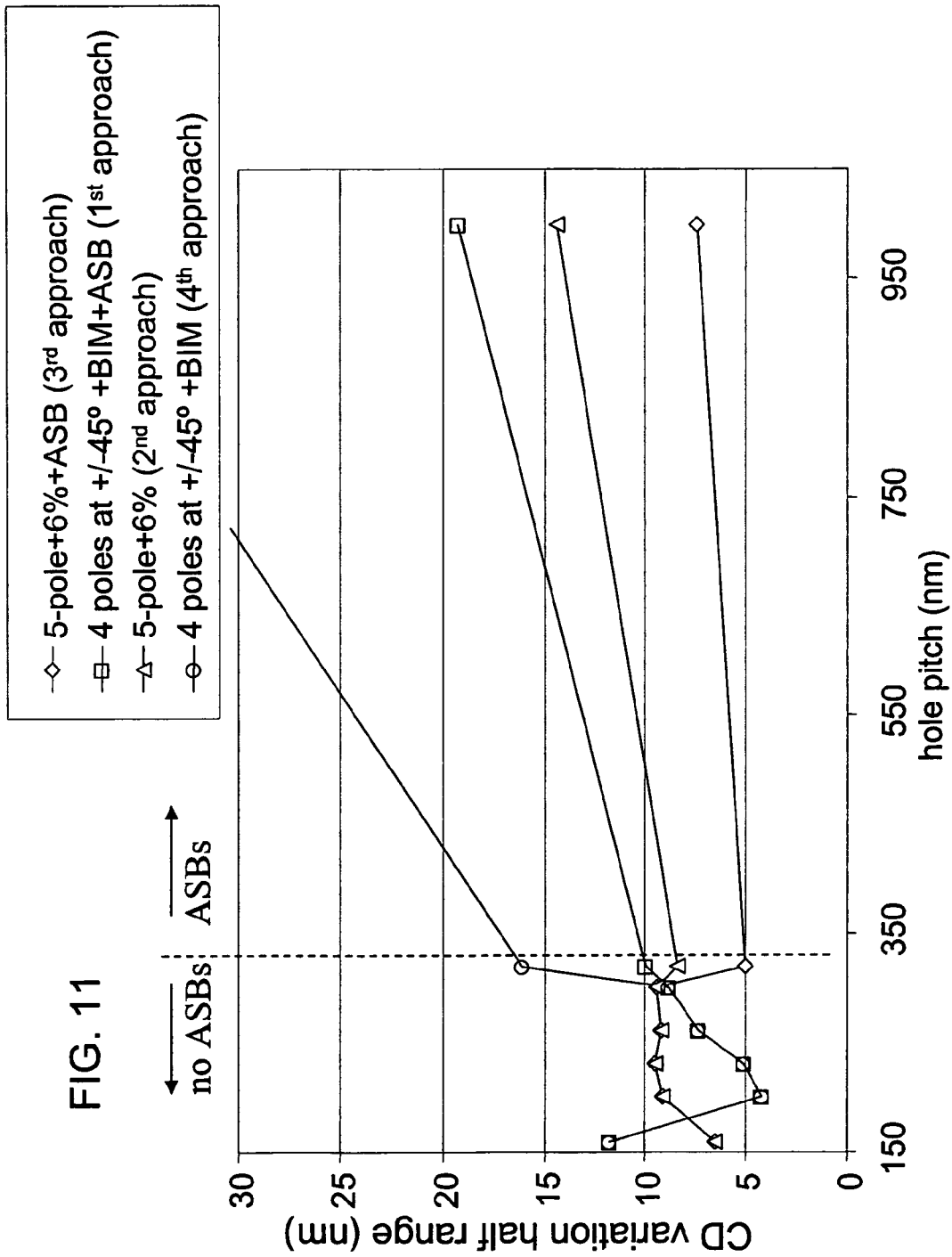
FIG. 11 shows the simulated critical dimension variation half range as a function of hole pitch for several illumination contributions.

FIG. 11 shows the simulated critical dimension variation half range as a function of hole pitch for several imaging solutions that may be used to print the full pitch range. Calculations are done for 80 nm contact holes. The imaging solutions include: 1) the first approach (off-axis illumination, binary mask (BIM) and assist features (anti-scattering bars)—see FIG. 5A), 2) the second approach (multipole illumination including on and off-axis components and an attenuated phase shift mask (6% att-PSM)), 3) the third approach (five pole illumination including on and off-axis components, attenuated phase shift mask (6% att-PSM), and assist features (anti-scattering bars)), and 4) a fourth approach that combines off-axis poles, arranged at about +/−45° relative to the horizontal axis of the illuminator, with a binary mask (BIM). In FIG. 11, the off-axis illumination of the first, second, third and fourth approaches includes poles that are arranged at about +/−45° relative to the horizontal axis of the illuminator. The fourth approach essentially consist of the first approach without using assist features.

As can be seen in FIG. 11, the fourth approach (off-axis illumination+BIM) produces poor imaging performances for loose pitches. The imaging performance for pitches greater than 300 nm may, however, be improved with the use of anti-scattering bars (first approach) (off-axis illumination+BIM+ASB). As previously shown in FIG. 6A, the second approach (5-pole+6%) may give better through pitch performance than the first approach. However, the best results are obtained with the third approach (5 poles+6% att-PSM+ASB) since CD variation half range remains smaller than 10 nm from 300 nm to 1000 nm. Similar results are obtained for pitches larger than 1000 nm, ranging up to completely isolated. The success of this procedure is expected to depend mainly on the Rayleigh k1 factor for the minimum half-pitch, and so with higher NA and/or shorter wavelength and so extension to pitches as small as 100 nm is possible.

It will be appreciated that the transmission of the phase shift mask in the third approach may not be limited to 6%. The mask transmission is selected because of its aptitude to provide satisfactory results for a given lithographic problem (i.e., feature size and pitch range). Therefore, the mask transmission may vary in other embodiments of the invention. For example, the mask transmission may be in the range of about 3% to 30% depending on the features and the pitch range studied.

Furthermore, it will be appreciated that the off-axis illumination used in the third approach is not limited to off-axis poles arranged at about +/−45° relative to the horizontal axis of the illuminator. Similarly to the mask transmission, it will be appreciated that the off-axis illumination is selected for its aptitude to provide satisfactory results for a given lithographic problem (i.e., feature size and pitch range). In an embodiment of the invention, the off-axis component may consist of a dipole arranged on the horizontal axis or the vertical axis of the illuminator. In another embodiment of the invention, the off-axis component may consist of a quadrupole arranged on the horizontal and vertical axis of the illuminator.

Figure 12:
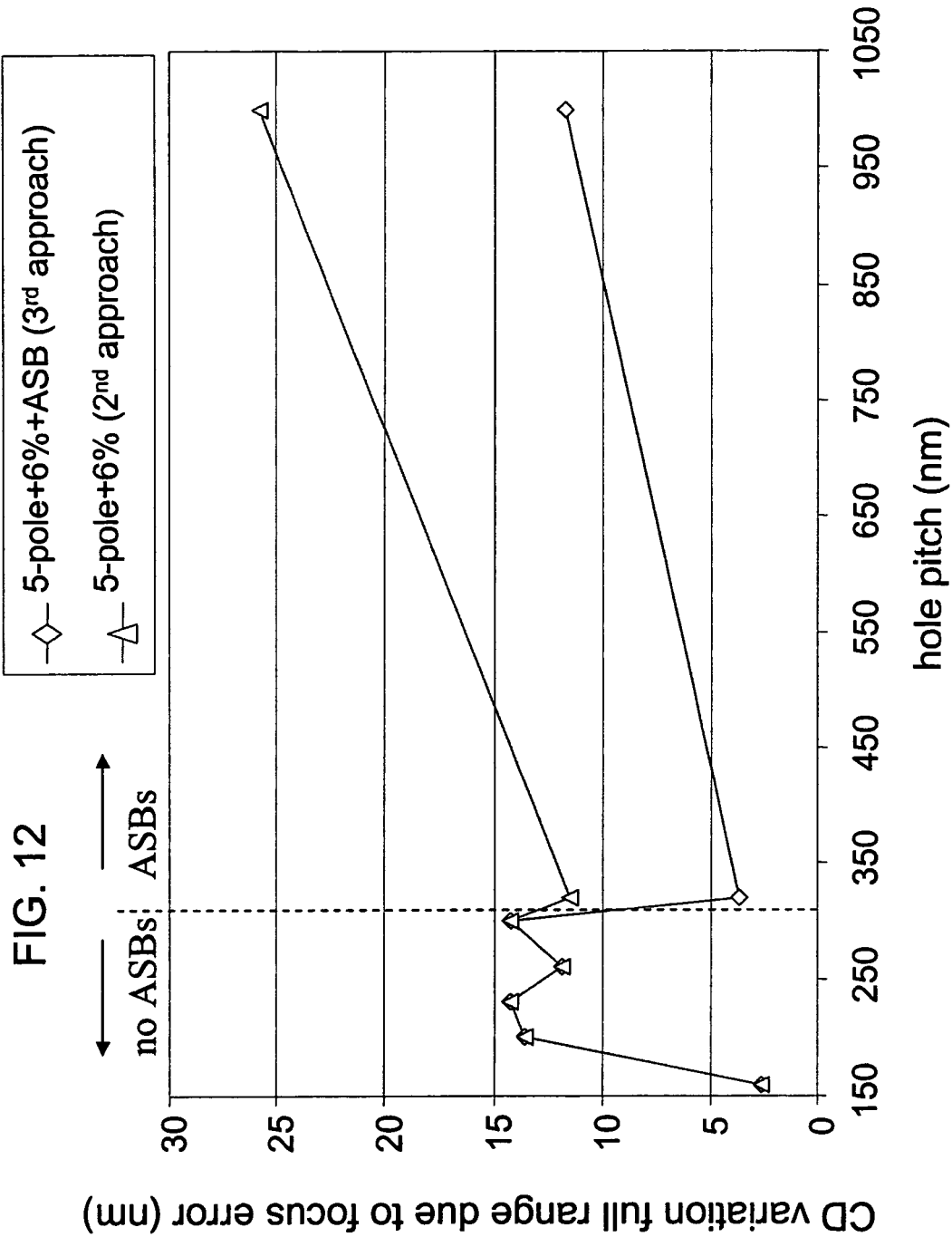
FIG. 12 shows simulated critical dimension variation full range due to focus error as a function of pitch for two illumination configurations.

Placement of anti-scattering bars at relaxed pitches, e.g., twice the minimum pitch, may greatly improve the imaging performance since there is less focus sensitivity. In an embodiment, the anti-scattering bars are 150 nm long and 60 nm wide. FIG. 12 shows simulated CD variation full range due to focus error as a function of pitch for the second and third approaches discussed above. The illumination configuration of the second and third approaches has the same characteristics as those of FIG. 9B. As can be seen in FIG. 12, placement of anti-scattering bars for pitches greater than (or equal to) twice the minimum pitch may greatly reduce CD variations.

Figure 13:
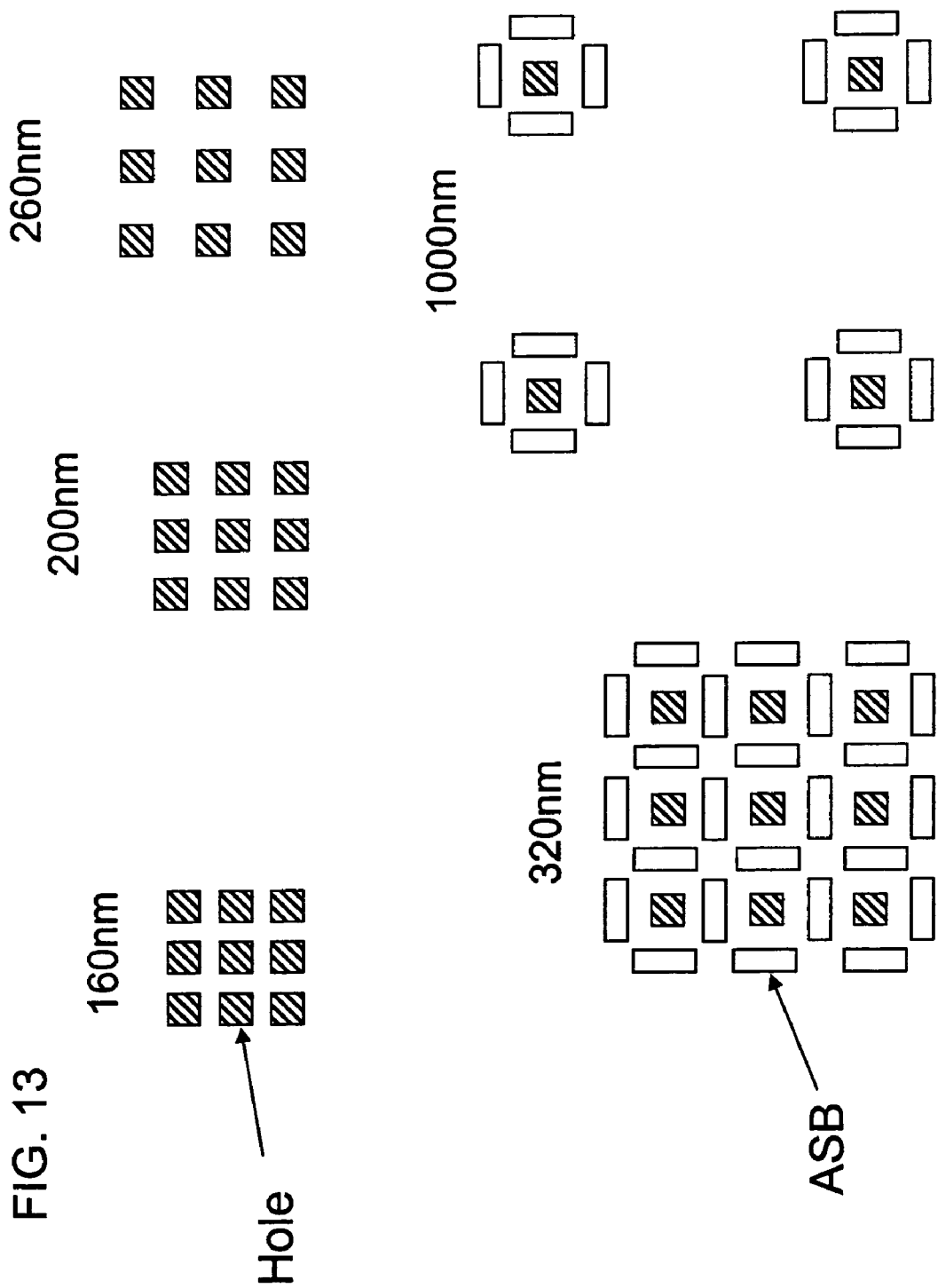
FIG. 13 shows schematically several regions of a 6% attenuated phase shift mask in accordance with an embodiment of the invention.

FIG. 13 shows several regions of a 6% attenuated phase shift mask that may be used in the third approach. The mask includes arrays of contact holes arranged in different pitches along with rectangular assist features. Assist features (anti-scattering bars, identified as "ASB" in FIG. 13) are placed in the 320 nm-1000 nm pitch range ($\geq$twice minimum pitch).

Results shown in FIGS. 11-12 indicate that a superior through pitch imaging solution may be obtained by combining assist features with an attenuated phase shift mask and an illumination that includes an on-axis and an off-axis component. With such a process, the source/global bias optimization may focus on the tight pitch range only since the use of assist features at larger pitches provides a good process window.

Although specific reference may be made in this text to the use of lithographic apparatus in the manufacture of ICs, it should be understood that the lithographic apparatus described herein may have other applications, such as the manufacturing of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, or electron beams.

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device in a way depending on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the beam of radiation, and such components may be referred to below, collectively or singularly, as a "lens."

The lithographic apparatus may be of a type having two (dual stage) or more substrate tables (and/or two or more support structures). In such "multiple stage" machines the additional tables or support structures may be used in parallel, or preparatory steps may be carried out on one or more tables or support structures while one or more other tables or support structures are being used for exposure.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example, between the mask and a first element of the projection system. Immersion techniques are well known in the art for increasing the numerical aperture of projection systems.

The methods described herein may be implemented as software, hardware or a combination. In an embodiment, there is provided a computer program comprising a program code that, when executed on a computer system, instructs the computer system to perform any or all of the methods described herein.

While specific embodiments of the invention have been described above, it will be appreciated that the invention may be practiced otherwise than as described. The description is not intended to limit the invention.

What is claimed is:

1. A method for transferring an image of a mask pattern through a pitch range onto a substrate, the mask pattern including printing features arranged in different pitches, the method comprising:
    determining a plurality of illumination shapes to image the printing features on the substrate at the different pitches of the pitch range so that, for each of the different pitches of the pitch range, an illumination shape that is suitable to image the printing features on the substrate is determined;

determining a multipole illumination to be used to illuminate the mask pattern based on the plurality of illumination shapes obtained for the different pitches of the pitch range;

illuminating the mask pattern of an attenuated phase shift mask using the multipole illumination, the mask pattern on said attenuated phase shift mask including the printing features arranged in the different pitches and anti-scattering bars, wherein the anti-scattering bars are placed only within said printing features that are arranged in a pitch at least equal to or larger than twice a minimum pitch of the printing features, and projecting an image of the illuminated mask pattern onto the substrate.

2. The method of claim 1, wherein a transmission of the attenuated phase shift mask is in the range of about 3% to 30%.

3. The method of claim 1, wherein the multipole illumination comprises a five pole illumination including one on-axis pole and four off-axis poles.

4. The method of claim 3, wherein the off-axis poles are arranged at about +/−45° relative to a horizontal axis of the illuminator that conditions the multipole illumination.

5. The method of claim 3, wherein an inner radius of the off-axis poles has a normalized value between about 0.6 and 0.8.

6. The method of claim 3, wherein an outer radius of the off-axis poles has a normalized value between about 0.8 and 1.

7. The method of claim 3, wherein a radius of an on-axis pole has a normalized value between about 0.1 and 0.4.

8. The method of claim 1, wherein the mask pattern is a random pattern of contact holes.

9. The method of claim 8, wherein a size of the contact holes is less than or equal to about 120 nm.

10. The method of claim 1, wherein the mask pattern comprises a mask pattern bias to transfer the image of the mask pattern to a desired dimension onto the substrate, said mask pattern bias varying within a pitch range of the mask pattern.

11. The method of claim 10, wherein the mask pattern bias is lower than about 35 nm for a 160 nm-1000 nm pitch range.

12. The method of claim 1, wherein the pitch range is about 100 nm-1000 nm.

13. The method of claim 1, wherein the pattern exposed onto the substrate includes features corresponding to a $k_1$ factor of less than or equal to 0.4.

14. The method of claim 1, comprising simulating an image of the printing features on the substrate for each of the different pitches of the pitch range and calculating a lithographic response, for each of the different pitches of the pitch range, using the simulated image of the printing features to determine the illumination shape.

15. The method of claim 14, wherein the lithographic response is a quadratic sum of at least two parameters selected from the group consisting of exposure dose, focus and mask error.

16. The method of claim 1, wherein the lithographic response includes at least one of depth of focus, exposure latitude, dose to size, dense to isolated feature bias, sidelobe printing, film loss, sidewall angle, mask error enhancement factor, or critical dimension uniformity.

17. The method of claim 16, wherein the lithographic response is mask error enhancement factor.

18. A device manufacturing method for transferring an image of a mask pattern through a pitch range onto a substrate, the mask pattern including printing features arranged in different pitches, the method comprising:

determining a plurality of illumination shapes to image the printing features on the substrate at the different pitches of the pitch range so that, for each of the different pitches of the pitch range, an illumination shape that is suitable to image the printing features on the substrate is determined;

determining a multipole illumination to be used to illuminate the mask pattern based on the plurality of illumination shapes determined for the different pitches of the pitch range;

conditioning a beam of radiation, said beam of radiation including the multipole illumination;

patterning said beam of radiation with an attenuated phase shift mask to form a patterned beam of radiation, said attenuated phase shift mask including the printing features arranged in the different pitches and anti-scattering bars, wherein the anti-scattering bars are placed only within said printing features that are arranged in a pitch at least equal to or larger than twice a minimum pitch of the printing features; and projecting said patterned beam of radiation onto the substrate.

19. The method of claim 18, wherein a transmission of the attenuated phase shift mask is in the range of about 3% to 30%.

20. The method of claim 18, wherein the multipole illumination comprises a five pole illumination including an on-axis pole and four off-axis poles.

21. The method of claim 20, wherein the off-axis poles are arranged at about +1-45° relative to a horizontal axis of the illuminator.

22. The method of claim 20, wherein an inner radius of the off-axis poles has a normalized value between about 0.6 and 0.8.

23. The method of claim 20, wherein an outer radius of the off-axis poles has a normalized value between about 0.8 and 1.

24. The method of claim 20, wherein a radius of an on-axis pole has a normalized value between about 0.1 and 0.4.

25. The method of claim 18, wherein the mask pattern is a random pattern of contact holes.

26. The method of claim 25, wherein a size of the contact holes is less than or equal to about 120 nm.

27. The method of claim 23, wherein the mask pattern comprises a mask pattern bias to transfer the image of the mask pattern to a desired dimension onto the substrate.

28. The method of claim 27, wherein the mask pattern bias is lower than about 35 nm for a 160 nm-1000 nm pitch range.

29. The method of claim 18, wherein the pitch range is about 100 nm-1000 nm.

30. The method of claim 18, wherein the pattern exposed onto the substrate includes features corresponding to a $k_1$ factor of less than or equal to 0.4.

* * * * *